United States Patent
Uematsu et al.

(10) Patent No.: US 7,852,145 B2
(45) Date of Patent: Dec. 14, 2010

(54) SEMICONDUCTOR DEVICE HAVING POWER SUPPLY SYSTEM

(75) Inventors: Yutaka Uematsu, Yokohama (JP); Hideki Osaka, Naka-gun (JP); Tatusya Saito, Tokyo (JP); Yoji Nishio, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 45 days.

(21) Appl. No.: 12/320,367

(22) Filed: Jan. 23, 2009

(65) Prior Publication Data

US 2009/0195295 A1    Aug. 6, 2009

(30) Foreign Application Priority Data

Jan. 24, 2008   (JP) .......................... P2008-013559

(51) Int. Cl.
*G05F 1/10*     (2006.01)

(52) U.S. Cl. ...................... 327/545; 327/553; 327/564

(58) Field of Classification Search ................. 327/545, 327/549, 551, 552, 553, 564, 565
See application file for complete search history.

(56) References Cited

U.S. PATENT DOCUMENTS

| | | | | |
|---|---|---|---|---|
| 4,783,603 A * | 11/1988 | Goforth et al. | ................. | 326/71 |
| 5,874,854 A * | 2/1999 | Skergan | ...................... | 327/545 |
| 5,926,061 A * | 7/1999 | Usui | .......................... | 327/538 |
| 6,057,729 A * | 5/2000 | Nomura | ...................... | 327/592 |
| 6,657,318 B2 * | 12/2003 | Ishikawa et al. | .............. | 307/30 |
| 7,199,490 B2 * | 4/2007 | Nomura | ...................... | 307/115 |

\* cited by examiner

*Primary Examiner*—Jeffrey S Zweizig
(74) *Attorney, Agent, or Firm*—McGinn IP Law Group, PLLC

(57) ABSTRACT

A semiconductor device is provided which includes: a first semiconductor integrated circuit; a ground line and a power supply line trough which electric power is supplied to the first semiconductor integrated circuit; and a variable impedance component which is connected between the ground line and the power supply line.

20 Claims, 13 Drawing Sheets

FIG. 14A
FIG. 14B
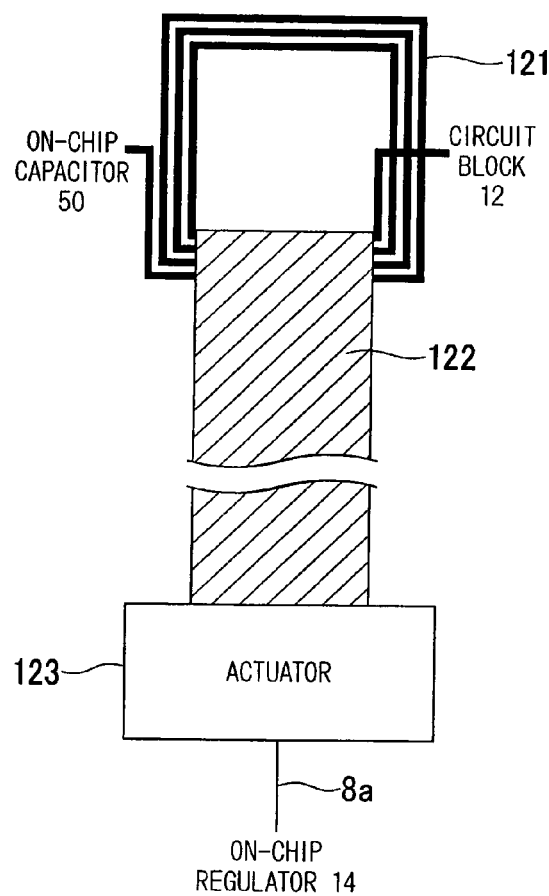
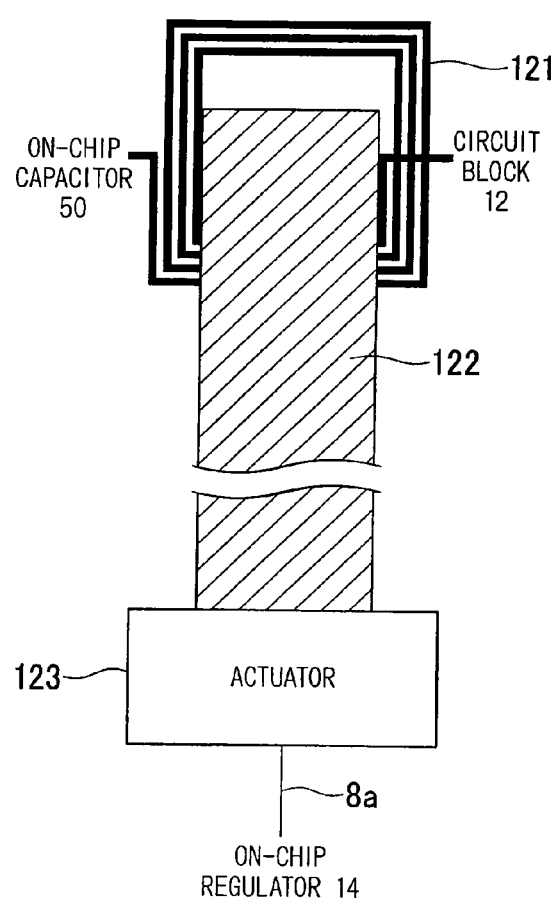

| POTENTIAL V1 | GND | VDD | Hi-Z |
|---|---|---|---|
| CAPACITANCE BETWEEN VDD AND GND | C2+C3 | C1+C3 | (C1C2/(C1+C2))+C3 |

| POTENTIAL V1 | GND | VDD | Hi-Z |
|---|---|---|---|
| CAPACITANCE BETWEEN VDD AND GND | C2+C3 | C1+C3 | (C1C2/(C1+C2))+C3 |
| ESL | L2//L3 | L1//L3 | (L1+L2)//L3 |
| ESR | R2//R3 | R1//R3 | (R1+R2)//R3 |

SEMICONDUCTOR DEVICE HAVING POWER SUPPLY SYSTEM

BACKGROUND OF THE INVENTION

1. Field of the Invention

The present invention relates to semiconductor devices. More particularly, the present invention relates to a semiconductor device which is provided with a power supply system which supplies electric power to a semiconductor integrated circuit.

Priority is claimed on Japanese Patent Application No. 2008-13559, filed Jan. 24, 2008, the content of which is incorporated herein by reference.

2. Description of Related Art

The inventors of the present invention investigated the following techniques in the art of semiconductor devices.

In the art of semiconductor devices, it is becoming considerably difficult to design measures against power supply noise as with succeeding generations of LSIs (Large Scale Integrated circuits). Such difficulty is caused by an increase in current consumption of semiconductor elements which are required to operate at a high rate; an increase in power supply noise accompanied by the high speed operation of the semiconductor elements; and minimization of a noise margin due to a reduction in a power supply voltage accompanied by an advance in semiconductor processes. Under such circumstances, in view of the fact that voltage is a product of current and impedance, one of the solutions for controlling the voltage of power supply noise so as to be a lower voltage is to minimize the impedance value of a power supply system over a wide band. In order to realize such an impedance minimization over a wide band, a number of different kinds of decoupling capacitors have been mounted on a printed circuit board or arranged in a semiconductor package. This is because different kinds of decoupling capacitors have different resonance frequencies and the impedance values thereof are minimized at these resonance frequencies.

For example, in Japanese Unexamined Patent Application, First Publication No. 2002-223077 hereinafter referred to as "Patent Document 1"), a number of capacitors are provided in a multilayer wire substrate so that the impedance value of a power supply system at a anti-resonance frequency is less than or equal to a predetermined value, thereby realizing a low impedance value over a wide band.

In addition, in Japanese Unexamined Patent Application, First Publication No. 2001-119110 (hereinafter referred to as "Patent Document 2"), the lengths of power supply lines provided for a number of decoupling capacitors are controlled so as to precisely control impedance profiles thereof, thereby realizing a low impedance value over a wide band.

The inventors of the present invention recognized the following matters. Specifically, the inventors of the present invention studied the aforementioned techniques for semiconductor devices, and revealed the following matters.

Since both of these techniques require a number of capacitors, the number of layers of substrates increases and the sizes of the substrates increase.

The techniques of realizing low power supply noise set forth above may be effective methods for semiconductor devices provided in apparatuses such as a personal computer, which is provided with a printed circuit board having a sufficiently large size.

However, these methods cannot apply to printed circuit boards which are provided in small-sized semiconductor devices such as a mobile phone. Specifically, since electronic components other than capacitors are densely provided in small-sized semiconductor equipment, printed circuit boards does not have sufficient space for the capacitors, and hence the number of chip capacitors that can be provided therein is restricted.

SUMMARY

The present invention seeks to solve one or more of the above problems, or to improve upon those problems at least in part.

In one embodiment, there is provided a semiconductor device that includes: a first semiconductor integrated circuit, a ground line and a power supply line through which electric power is supplied to the first semiconductor integrated circuit; and a variable impedance component which is connected between the ground line and the power supply line.

In another embodiment, there is provided a semiconductor device that includes: a semiconductor integrated circuit; a power supply system which supplies electric power to the semiconductor integrated circuit; and a variable impedance component whose impedance is varied to adjust the impedance of the power supply system.

In accordance with the foregoing embodiments, by dynamically controlling the impedance value of the variable impedance component, it is possible to realize a low impedance value of the power supply system over a wide band using a small number of chip components, without providing a number of different kinds of decoupling capacitors having different resonance frequencies. Reduction in the number of components results in minimization of the size of a substrate on which the semiconductor device is mounted. Therefore, it is possible to realize dense implementation of semiconductor integrated circuits and reduction in power supply noise thereof. Hence, it is possible to realize not only a small area but also low power supply noise in the semiconductor device and a printed circuit board which mount the semiconductor device. In addition, a low impedance value of the power supply system can be realized over a wide band even in small-sized semiconductor equipment such as a mobile phone in which electronic components are densely mounted on a printed circuit board and space for mounting capacitors is restricted.

BRIEF DESCRIPTION OF THE DRAWINGS

The above features and advantages of the present invention will be more apparent from the following description of certain preferred embodiments taken in conjunction with the accompanying drawings, in which:

FIG. 14A and FIG. 14B are diagrams showing the structure of another example of a variable inductance component in the fourth embodiment of the present invention;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the present invention is not limited to the embodiments illustrated for explanatory purposes.

Hereinbelow, the details of embodiments of the present invention will be explained with reference to the accompanied drawings. In all of the drawings illustrating the embodiments, the same reference symbols are assigned to the same members, and the repetitive explanation thereof will be omitted.

First, the background technique will be explained so as to facilitate the understanding of various features of the present invention by comparing the background technique with the present invention.

Background Technique

Figure 2:
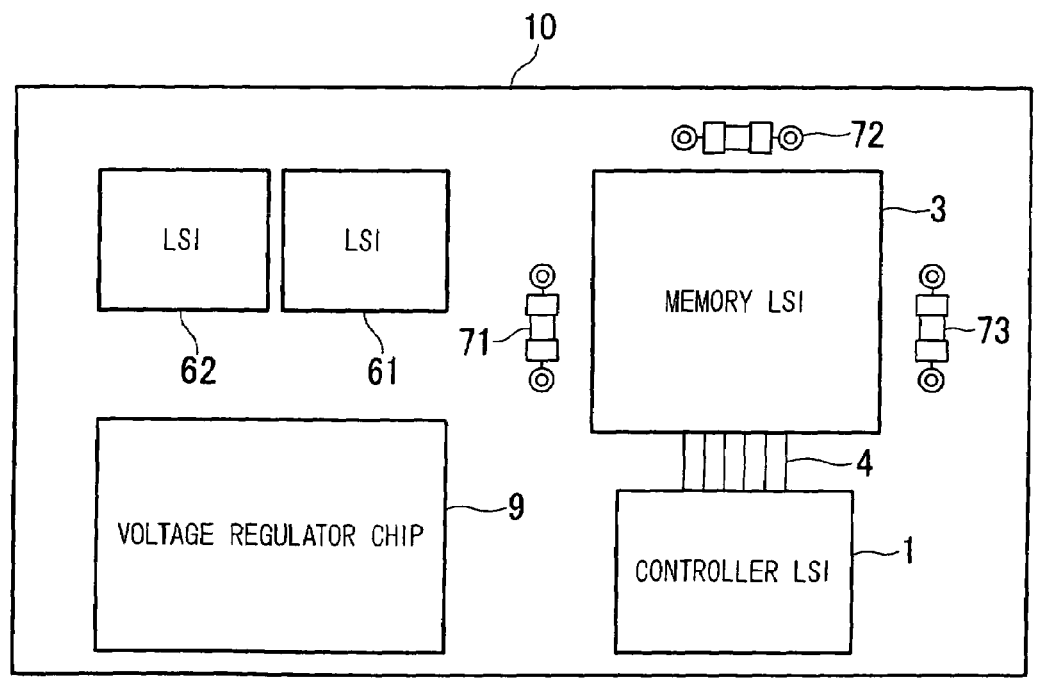
FIG. 2 is a diagram showing the structure of a printed circuit board which is provided in a semiconductor device in accordance with a technique on which the present invention is based (hereinafter referred to as "a background technique")

FIG. 2 shows the structure of a printed circuit board PCB) which is provided in a small-sized semiconductor device in accordance with the background technique. As shown in FIG. 2, a printed circuit board 10 is provided with: various kinds of LSIs 61 and 62; a memory LSI 3 such as a dynamic random access memory (DRAM); a controller LSI 1 which outputs a control signal to the memory LSI 3 to control the operation of the memory LSI 3; an on-board voltage regulator chip 9 which optimally controls various power supplies provided in the printed circuit board 10; and various kinds of decoupling capacitor chip components 71-73 used for reducing power supply noise of the memory LSI 3. Although the controller LSI 1 and the memory LSI 3 in this example are separately provided, they may be stacked in accordance with a package-on-package (POP) technique and may be sealed in a single package.

Figure 4:
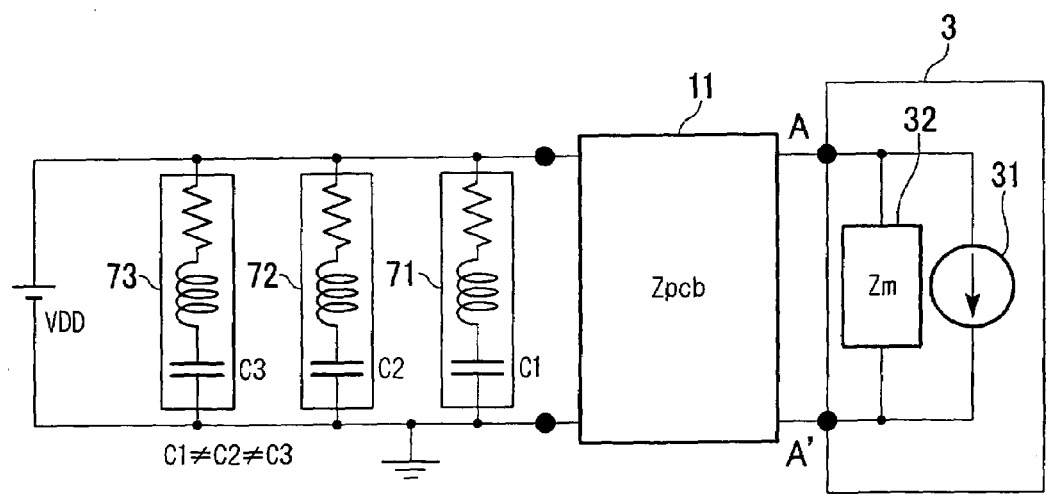
FIG. 4 is a diagram showing a simplified equivalent circuit of the structure shown in FIG. 2, which is provided in the semiconductor device in accordance with the background technique.

FIG. 4 shows a simplified electrical equivalent circuit of a power supply system on the printed circuit board in accordance with this background technique. For the sake of simplicity, FIG. 4 does not depict the details of the equivalent circuit of the voltage regulator chip 9. Instead, FIG. 4 depicts the voltage regulator chip 9 as a simple DC voltage source VDD. Additionally, FIG. 4 shows only three decoupling capacitor chip components. As shown in FIG. 4, the memory LSI 3 is represented by a power supply current source 31 and an impedance model 32 of its chip (impedance Zm). The three decoupling capacitor chip components 71-73 mounted on the PCB have different capacitance values C1-C3, respectively, and hence the decoupling capacitor chip components have different resonance frequencies.

Figure 6:
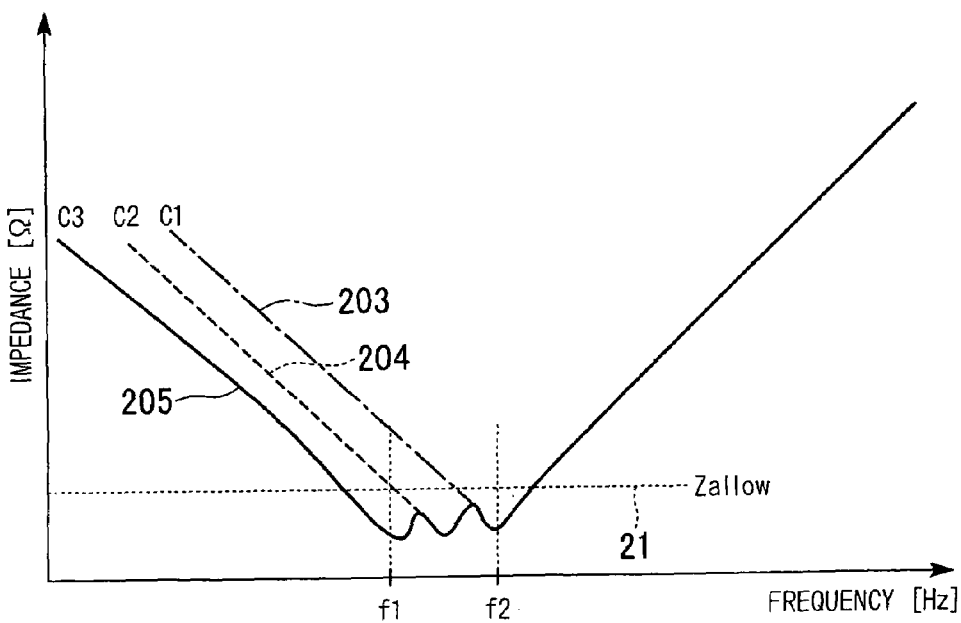
FIG. 6 is a diagram showing impedance profiles of a power supply system shown in FIG. 4, which is provided in the semiconductor device in accordance with the background technique.

FIG. 6 shows impedance profiles of the power supply system provided on the left of A-A' in FIG. 4. Now, it is assumed that the impedance value must be Zallow (an allowable impedance value 21) or below so as to maintain the level of noise of the power supply system to a target level or below. In general, the major frequency of power supply current in DRAMs varies depending on operation modes. This is because duration during which relevant circuits are activated varies depending on respective operations, and because the length of the duration determines the major frequency of the power supply current. Now, it is assumed that there are two operations including an operation 1 and an operation 2 which are major factors causing noise in a DRAM, and that these operations respectively generate frequency components f1 and f2 in the power source current. In this case, the impedance value must be the Zallow or below both in the operation at the frequency f1 and in the operation at the frequency f2. One of methods for satisfying this condition is to provide a plurality of impedance resonance points by means of a plurality kinds of decoupling capacitors as shown in FIG. 6 (see the impedance profiles designated by reference symbols 203-205). However, this method requires a number of decoupling capacitor chip components mounted on the printed circuit board, as shown in FIG. 2. Therefore, it is difficult to apply this method to systems having a small-sized printed circuit board.

First Embodiment

Figure 1:
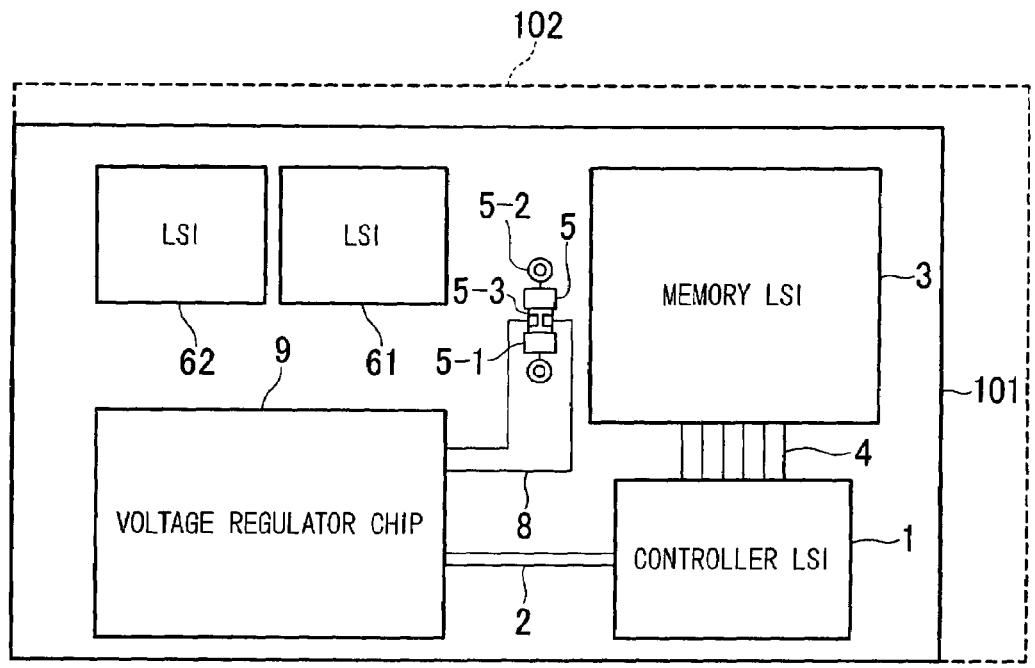
FIG. 1 is a diagram showing the structure of a printed circuit board (PCB) on which a capacitance-variable capacitor is mounted and which is provided in a semiconductor device in accordance with a first embodiment of the present invention.

FIG. 1 is a diagram showing the structure of a semiconductor device in accordance with a first embodiment of the present invention.

First, the structure of the semiconductor device in accordance with the first embodiment will be explained with reference to FIG. 1. On a printed circuit board 101, there are provided: a memory LSI 3 (a first semiconductor integrated circuit; e.g., a DRAM) in which noise is to be reduced; an on-board voltage regulator chip 9 (a second semiconductor integrated circuit); a controller LSI 1 (a third semiconductor integrated circuit) which controls the memory LSI 3; a decoupling capacitor 5 (a variable impedance component) which varies its own capacitance value in accordance with a bias voltage applied to a capacitance control terminal 5-3; LSIs 61 and 62; and so forth. A terminal 5-1 and a terminal 5-2 (a first terminal and a second terminal) of the decoupling capacitor 5 are respectively connected to a ground line and a power supply line which supply electric power to the memory LSI 3. It should be noted that the ground line and the power supply line are formed inside the printed circuit board 101, and hence they are not shown in FIG. 1. Moreover, FIG. 1 depicts only signal lines which are relevant to adjustment of the capacitance value of the decoupling capacitor 5.

The voltage regulator chip 9 is capable of controlling its own output voltage. The voltage regulator chip 9 is provided with a terminal through which the output voltage is supplied to the capacitance control terminal 5-3 of the decoupling capacitor 5 provided on the printed circuit board 101. The capacitance value of the decoupling capacitor 5 is controlled by the output voltage of the voltage regulator chip 9. The controller LSI 1 is provided with terminals through which control signals are supplied to the voltage regulator chip 9. The controller LSI 1 supplies control signals to the memory LSI 3 at the same time the control signals are supplied to the voltage regulator chip 9. By doing so, the voltage regulator chip 9 controls the impedance value of the decoupling capacitor 5 based on control operations by the controller LSI 1. To this end, the voltage regulator chip 9 detects the next operation of the memory LSI 3, and adjusts the output voltage to the decoupling capacitor 5 so as to change the capacitance value of the decoupling capacitor 5 to a capacitance value corresponding to the next operation. In other words, the voltage regulator chip 9 dynamically controls the capacitance value of the capacitance-variable decoupling capacitor 5, which is connected to the power supply system for the memory LSI 3, in accordance with the operation of the memory LSI 3. As a result, it is possible to realize a lower impedance value of the power supply system for the memory LSI 3 over a wide band using a small number of chip components.

In this way, in order to solve the problems of the background technique, as shown in FIG. 1, the first embodiment is provided with a small number of capacitance-variable decoupling capacitors (in this example, a single decoupling capacitor 5) each having a capacitance control terminal. With the structure shown in FIG. 1, it is sufficient to provide a smaller number of decoupling capacitors compared to that in the structure shown in FIG. 2, so that it is possible to reduce the size of the printed wiring board to a smaller size than the size of the printed wiring board shown in FIG. 2. Specifically, the size 102 of the printed circuit board in accordance with the background technique can be reduced to the size shown by the printed circuit board 101. The decoupling capacitor 5 is provided with the capacitance control terminal 5-3, which is connected to the voltage regulator chip 9 via capacitance control power supply lines 8. The controller LSI 1 is connected to the voltage regulator chip 9 via regulator control signal lines 2. The controller LSI 1 is connected to the memory LSI 3 via memory control signal lines 4.

It should be noted that an example of the decoupling capacitor 5, whose capacitance value is controlled by an externally applied voltage, is a capacitor by means of a micro-electro-mechanical system (MEMS). This capacitor employs the mechanism which uses electrodes made of a piezoelectric material that form capacitance and varies the capacitance value by changing the interval between the electrodes in accordance with the externally applied voltage.

The controller LSI 1 sends control signals for controlling the memory LSI 3 to the memory LSI 3 via the memory control signal lines 4. At the same time, the controller LSI 1 sends control signals corresponding to the details of control of the memory LSI 3 to the voltage regulator chip 9 via the regulator control signal lines 2. The voltage regulator chip 9 detects the next operation of the memory LSI 3 using these signals. In the case in which the next operation may cause a large amount of noise, the voltage regulator chip 9 applies a necessary voltage to the capacitance control terminal 5-3 of the decoupling capacitor 5 so that the major frequency of the power supply current resulting from the execution of the next operation by the memory LSI 3 coincides with the resonance frequency of the decoupling capacitor 5.

It should be noted that the controller LSI 1 and the voltage regulator chip 9 may be integrated in a single semiconductor chip.

Figure 3:
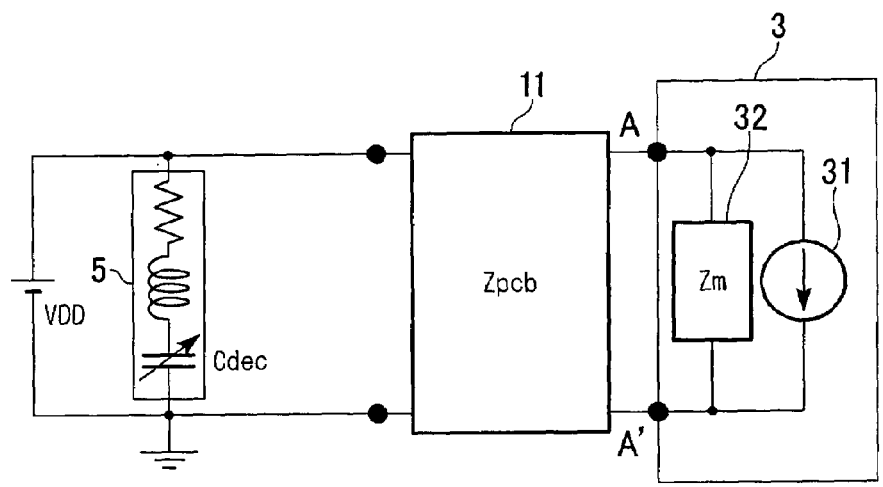
FIG. 3 is a diagram showing a simplified equivalent circuit of the structure shown in FIG. 1, which is provided in the semiconductor device in accordance with the first embodiment of the present invention.

FIG. 3 shows a simplified electrical equivalent circuit of the power supply system for the printed wiring board provided in the semiconductor device in accordance with the first embodiment. For the sake of simplicity, FIG. 3 does not depict the details of the equivalent circuit of the voltage regulator chip 9, in the same manner as FIG. 4. In FIG. 3, the memory LSI 3 is represented by a power supply current source 31 and an impedance model 32 of its chip. Reference symbol 11 denotes an impedance matrix (impedance Zpcb) of the printed circuit board 101 between the decoupling capacitor 5 having a capacitance value Cdec and the memory LSI 3. The decoupling capacitor absorbs/shuts off power supply noise caused by other circuits (not shown in FIG. 3) connected on the side of power supply VDD, thereby reducing the power supply noise.

Figure 5:
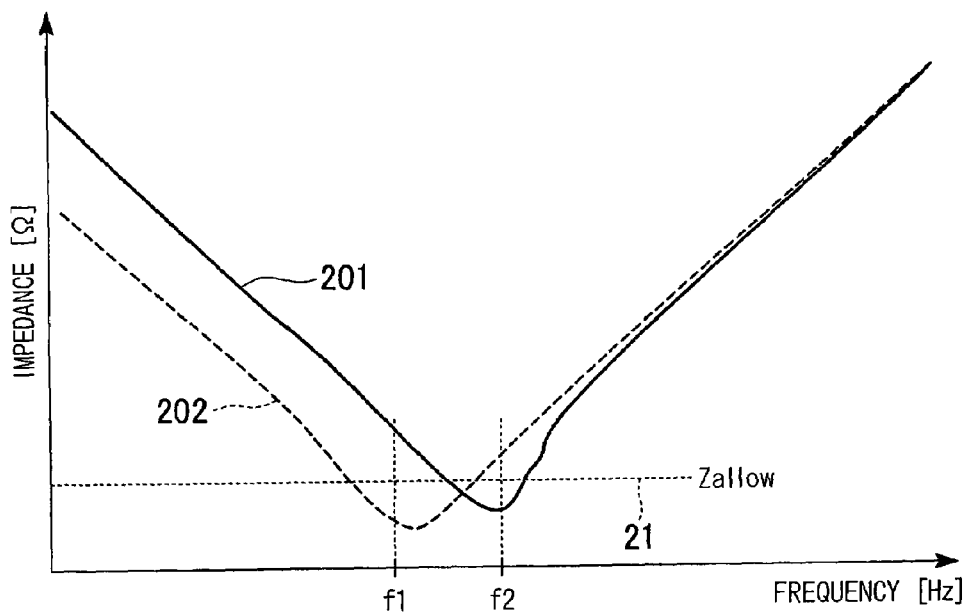
FIG. 5 is a diagram showing impedance profiles of a power supply system shown in FIG. 3, which is provided in the semiconductor device in accordance with the first embodiment of the present invention.

The equivalent circuit shown in FIG. 3 is different from the equivalent circuit shown in FIG. 4 in that the number of modeled decoupling capacitors in FIG. 3 is smaller than that in FIG. 4 and that the capacitance value of the decoupling capacitor in FIG. 3 is variable. FIG. 5 shows impedance profiles of the power supply system which is provided on the left of A-A' in FIG. 3. A single capacitor is provided as shown in FIG. 3, so that there is only one resonance frequency as shown in FIG. 5. However, since the capacitance value of the capacitor is variable as shown in FIG. 3, the resonance frequency can be changed as shown by impedance profiles 201 and 202 in FIG. 5, which are respectively represented by a solid line and a dotted line, by varying the capacitance value. For example, in the case of the operation 1 in which the frequency component f1 is generated in the power supply current, the capacitance value of the capacitor is changed so that the impedance profile becomes the impedance profile 202, in which the impedance value of the power supply system is smaller than the Zallow (the allowable impedance value 21) at the frequency f1. In contrast, in the case of the operation 2 in which the frequency component f2 is generated in the power supply current, the capacitance value of the capacitor is changed so that the impedance profile becomes the impedance profile 201.

Figure 7:
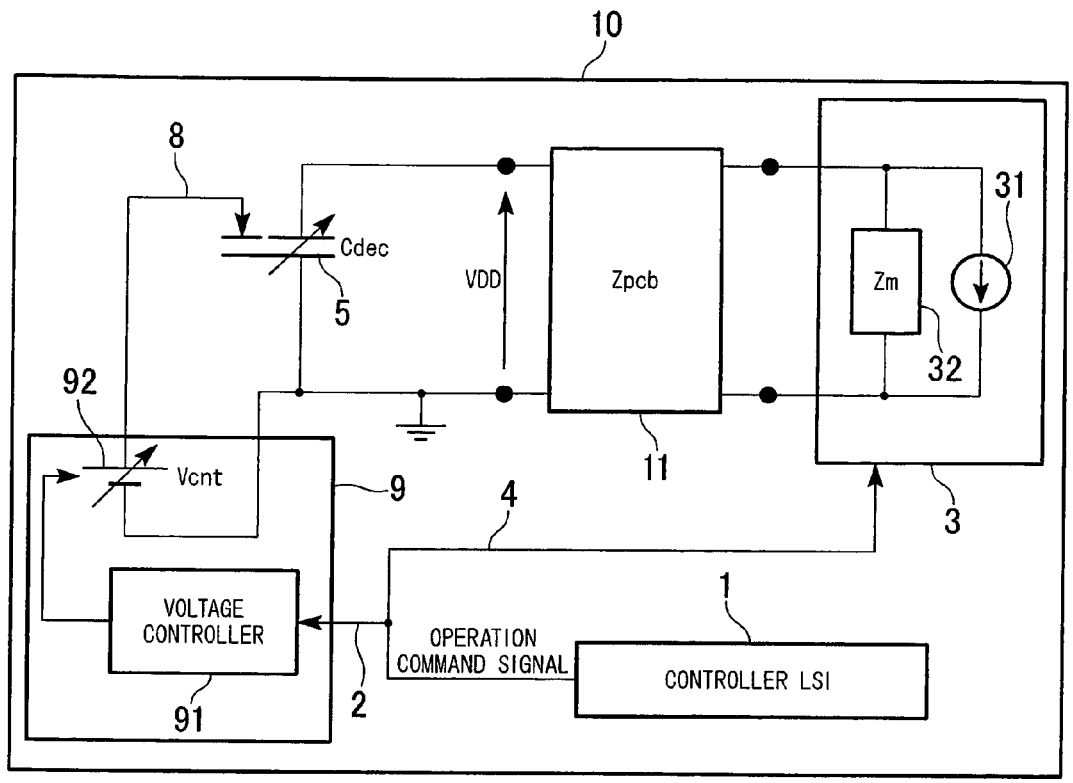
FIG. 7 is a block diagram showing an equivalent circuit of the structure shown in FIG. 1, which is provided in the semiconductor device in accordance with the first embodiment of the present invention, where the equivalent circuit includes components for controlling the capacitance value.

Next, the capacitance control in accordance with the first embodiment will be explained in more detail with reference to FIG. 7 and FIG. 8. FIG. 7 is a block diagram showing an equivalent circuit which also takes components for controlling the capacitance value shown in FIG. 1 into consideration. FIG. 7 includes the controller LSI 1 and the voltage regulator chip 9 in addition to the components included in the simplified equivalent circuit shown in FIG. 3. The voltage regulator chip 9 is provided with: a voltage controller 91; and a voltage source 92 whose output voltage Vcnt is varied in accordance with control by the voltage controller 91. The voltage source 92 is connected to the capacitance control terminal of the decoupling capacitor 5, and the capacitance value Cdec of the decoupling capacitor 5 is varied in accordance with the output voltage Vcnt of the voltage source 92.

Figure 8:
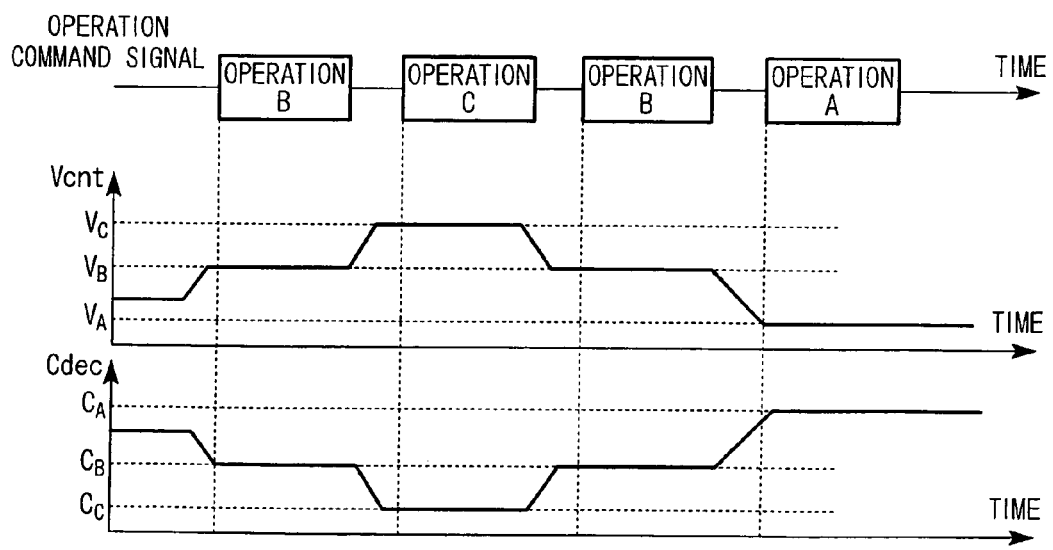
FIG. 8 is a timing chart for illustrating control in the structure shown in FIG. 7, which is provided in the semiconductor device in accordance with the first embodiment of the present invention.

FIG. 8 is a timing chart showing changes over the course of time with respect to the operation of the memory LSI 3; the output voltage Vcnt of the voltage source 92; and the capacitance value Cdec of the decoupling capacitor 5. Now, it is assumed that there are three kinds of operations including an operation A, an operation B, and an operation C, where frequencies of current during the respective operations are different from each other. For example, in the case in which the memory LSI 3 is a DRAM, the operation A is a refresh operation, the operation B is a read operation, and the operation C is a write operation. The upper portion of FIG. 8 shows the input timing of operation commands in the case in which the memory LSI 3 is operated in accordance with control signals (i.e., memory access commands; in other words, operation command signals) from the controller LSI 1. The middle portion of FIG. 8 shows a change over the course of time with respect to the output voltage Vcnt of the voltage source 92. The lower portion of FIG. 8 shows a change over the course of time with respect to the capacitance value Cdec of the decoupling capacitor 5. In FIG. 8, operation commands are input to the memory LSI 3 so as to correspond to the order of operations; that is, an operation B, an operation C, an operation B, and an operation A. It is assumed that the optimum capacitance values of the decoupling capacitor 5 for suppressing major frequency components of the power supply current (i.e., capacitance values of the decoupling capacitor 5 by which the frequencies of the power supply current coincide with the resonance frequencies of the power supply system) which are respectively generated in the operation A, the operation B, and the operation C, are $C_A$, $C_B$, and $C_C$, respectively. As shown by control shown in FIG. 8, the output voltage Vcnt is changed in accordance with each operation command immediately before the memory LSI 3 enters each operation mode, so that the capacitance value Cdec is changed, and at the time each operation starts the impedance value of the power supply system is changed to a value which minimizes the power supply current generated in each operation.

Such operations can be realized by a combination of a voltage regulator which has a function of receiving an operation command signal from the controller LSI and a decoupling capacitor whose capacitance value is changed in accordance with a control voltage generated by the voltage regulator. Most of regulators provided in recent portable equipment have the aforementioned function of the voltage regulator. This is because such portable equipment is required to dynamically adjust the power supply voltage in order to reduce power consumption. An example of the decoupling capacitor whose capacitance value is adjusted by the control voltage is a piezoelectrically-driven MEMS variable capacitor.

For example, in the case in which the semiconductor device is a DRAM, with respect to the respective frequencies of noise in a refresh operation (an operation A) and in a write operation (an operation C), the major frequency of noise in the refresh operation is estimated as approximately 10 MHz from the time during which relevant circuits are activated in the refresh operation, and the major frequency of noise in the write operation is estimated as approximately 30 MHz from the time during which relevant circuits are activated in the write operation. It should be noted that these values are simply criteria. As derived from the comparison between these noise frequencies, the noise frequency in the write operation is approximately triple the noise frequency in the refresh operation.

In order to equally reduce these noise components, the design method in accordance with the background technique uses a first decoupling capacitor; and a second decoupling capacitor whose resonance frequency is triple the resonance frequency of the first decoupling capacitor. Since a resonance frequency is defined by $(LC)^{-1/2}$, where L denotes inductance and C denotes capacitance, when capacitors having the same size (i.e., the same value of L) are used, two kinds of capacitors including a first capacitor; and a second capacitor whose capacitance value is approximately ten times the capacitance value of the first capacitor are required.

In the present embodiment, the two kinds of capacitors can be realized by a single variable capacitor. For example, a variable capacitor which is provided with a piezoelectric drive terminal and which is formed on a glass substrate realizes a capacitance change ratio of 9.8 by varying the voltage applied to the piezoelectric drive terminal from 0 V to 5.7 V. The present embodiment can be realized by using a decoupling capacitor formed by such a component.

Second Embodiment

Figure 9:
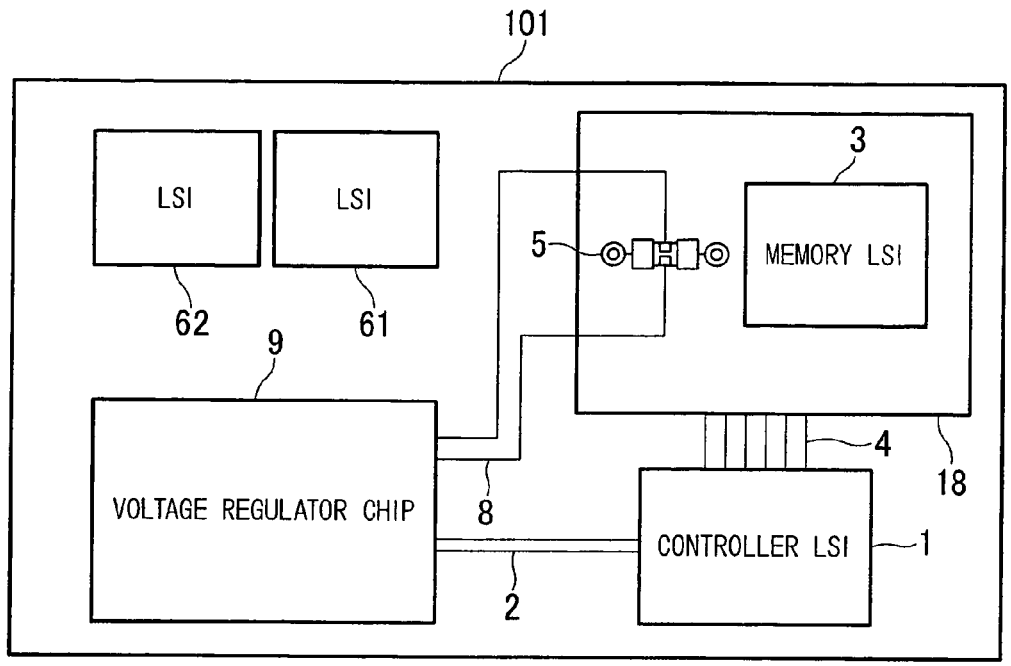
FIG. 9 is a diagram showing the structure of a semiconductor device in accordance with a second embodiment of the present invention, in which a capacitance-variable capacitor is provided in a package.

In a second embodiment of the present invention, a capacitance-variable decoupling capacitor is provided in an LSI package, not on a printed circuit board. The second embodiment of the present invention will be explained with reference to FIG. 9. FIG. 9 is a diagram showing the structure of a semiconductor device in accordance with the second embodiment of the present invention.

FIG. 9 is characterized in that a decoupling capacitor 5 having a capacitance control terminal is provided in a package 18 which seals a memory LSI 3.

The fundamental concept and the structure of the present embodiment are the same as those in the first embodiment. By allowing the adjustment of the capacitance value of the decoupling capacitor 5, which is arranged at a position closer to the memory LSI 3 than that in the first embodiment, it is possible to dynamically adjust the impedance value even for noise having a higher frequency than that of the first embodiment. Therefore, the present embodiment provides means which are effective to power supply noise having a frequency in a range from several tens MHz to several hundreds MHz. In the present embodiment, electrodes for the capacitor are provided in the package 18, and dedicated lines are provided in the package 18.

Third Embodiment

Figure 10:
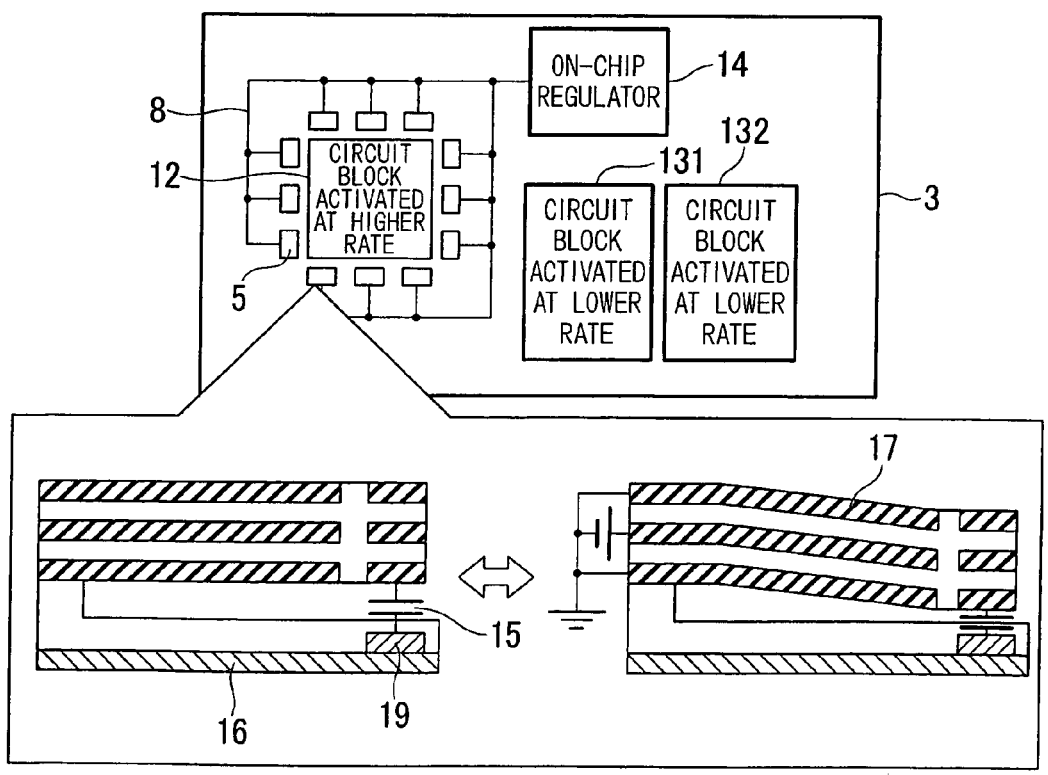
FIG. 10 is a diagram showing the structure of a semiconductor device in accordance with a third embodiment of the present invention, in which capacitance-variable decoupling capacitors are provided in a chip of a memory LSI.

In a third embodiment of the present invention, a capacitance-variable decoupling capacitor is provided in a chip of a memory LSI. The third embodiment of the present invention will be explained with reference to FIG. 10. FIG. 10 is a diagram showing the structure of a semiconductor device in accordance with the third embodiment of the present invention.

The enlarged view in FIG. 10 shows an example of the structure of a MEMS-based capacitance-variable decoupling capacitor 5. As shown by the enlarged view in FIG. 10, the decoupling capacitor 5 includes upper electrodes 17 made of a piezoelectric material, which forms a pair with a lower metal electrode 19 formed on a Si substrate, thereby forming a parallel plate capacitor 15. The parallel plate capacitor 15 is a variable capacitor whose capacitance value varies in accordance with a voltage applied to the upper electrodes 17. The upper electrodes 17 bend in accordance with the externally applied voltage, thereby the distance between the lower metal electrode 19 and the upper electrodes 17 is changed. Since the capacitance value of the parallel plate capacitor 15 is inversely proportional to the distance between the electrodes, the capacitance value can be changed by varying the distance corresponding to the externally applied voltage. Moreover, the lower metal electrode 19 is connected to a ground line 16 provided on the substrate. In FIG. 10, reference symbol 12 denotes a circuit block which is activated at a higher rate, reference symbols 131 and 132 denote circuit blocks which are activated at a lower rate, and reference symbol 14 denotes an on-chip regulator.

The fundamental concept and the structure of the present embodiment are the same as those of the first embodiment. Since the capacitance-adjustable decoupling capacitor is arranged in a chip of the memory LSI 3, more effective measures by means of dynamic impedance adjustment can be taken against noise having a higher frequency (in particular, several hundreds MHz or higher) than the frequency in the second embodiment. In FIG. 10, a lot of capacitance-variable capacitors are arranged in the periphery of the circuit block 12, which is provided in the memory LSI 3 and which may be activated at a particularly high rate and may cause a large amount of noise, and the capacitance values thereof are changed in accordance with the operation of the memory LSI 3 and under control of the on-chip regulator 14.

It should be noted that although not shown in FIG. 10, the memory LSI 3 includes a circuit block corresponding to the controller LSI 1 shown in FIG. 1 as well as a memory block. Moreover, although in FIG. 10, the on-chip regulator 14 is provided in the chip, a regulator may be provided outside the chip. Furthermore, although FIG. 10 shows an example in which the variable capacitor is formed by a piezoelectrically-driven MEMS device, the variable capacitor is not limited to such a structure as long as the capacitance value thereof is variable.

Fourth Embodiment

Figure 11:
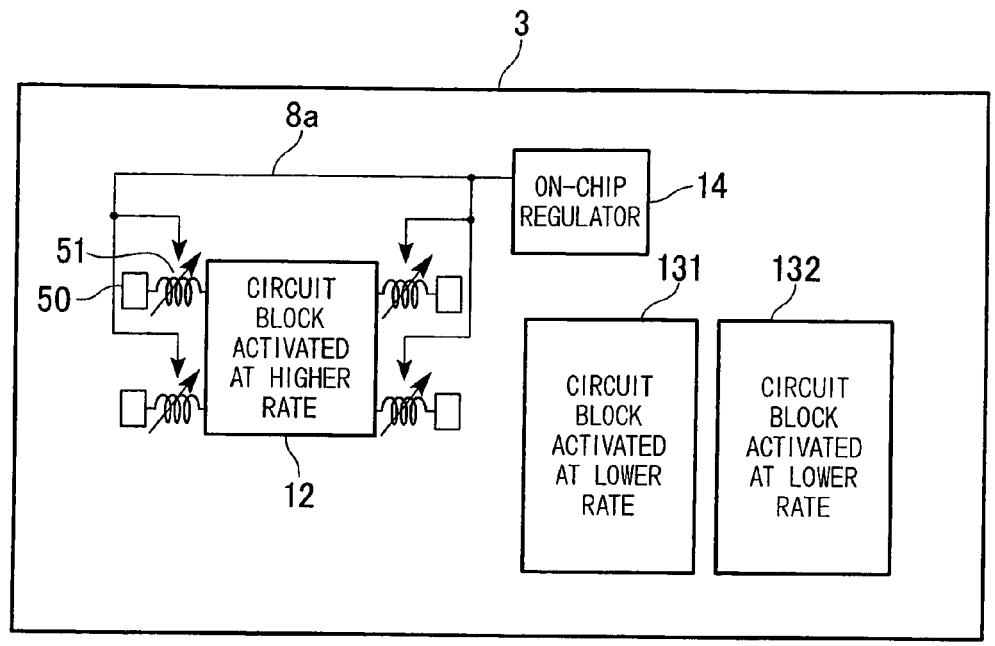
FIG. 11 is a diagram showing the structure of a semiconductor device in accordance with a fourth embodiment of the present invention, in which capacitors and variable inductors are provided in power supply lines.
Figure 12:
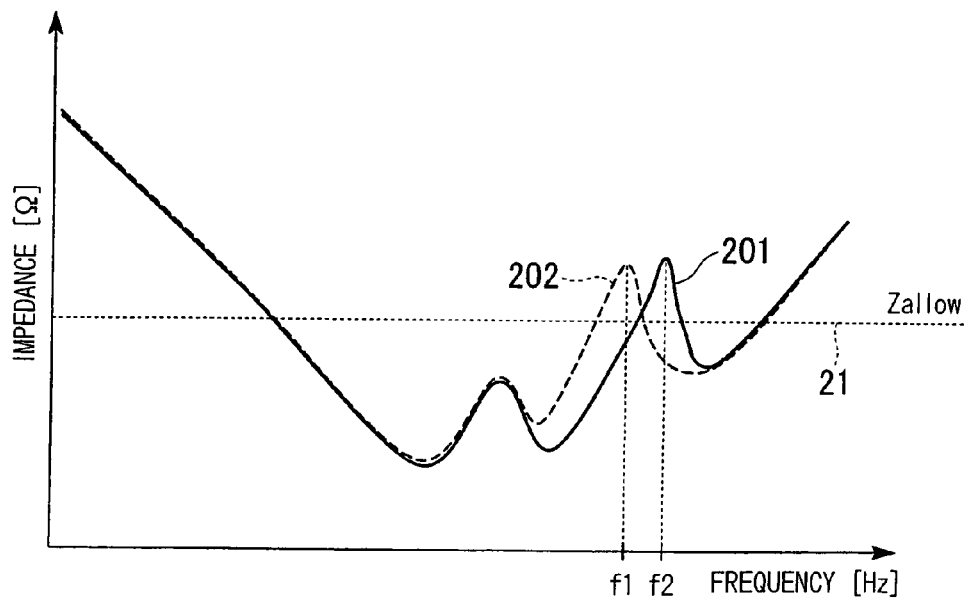
FIG. 12 is a diagram showing impedance profiles of a power supply system shown in FIG. 11, which is provided in the semiconductor device in accordance with the fourth embodiment of the present invention.

In order to realize the impedance adjustment of a power supply system, a fourth embodiment of the present invention employs inductance-variable inductors which are inserted in series relative to capacitors, instead of capacitance-variable capacitors as employed in the first embodiment to the third embodiment. The fourth embodiment of the present invention will be explained with reference to FIG. 11 and FIG. 12. FIG. 11 is a diagram showing the structure of a semiconductor device in accordance with the fourth embodiment of the present invention. FIG. 12 shows impedance profiles of a power supply system in the semiconductor device in accordance with the fourth embodiment of the present invention.

Figure 13:
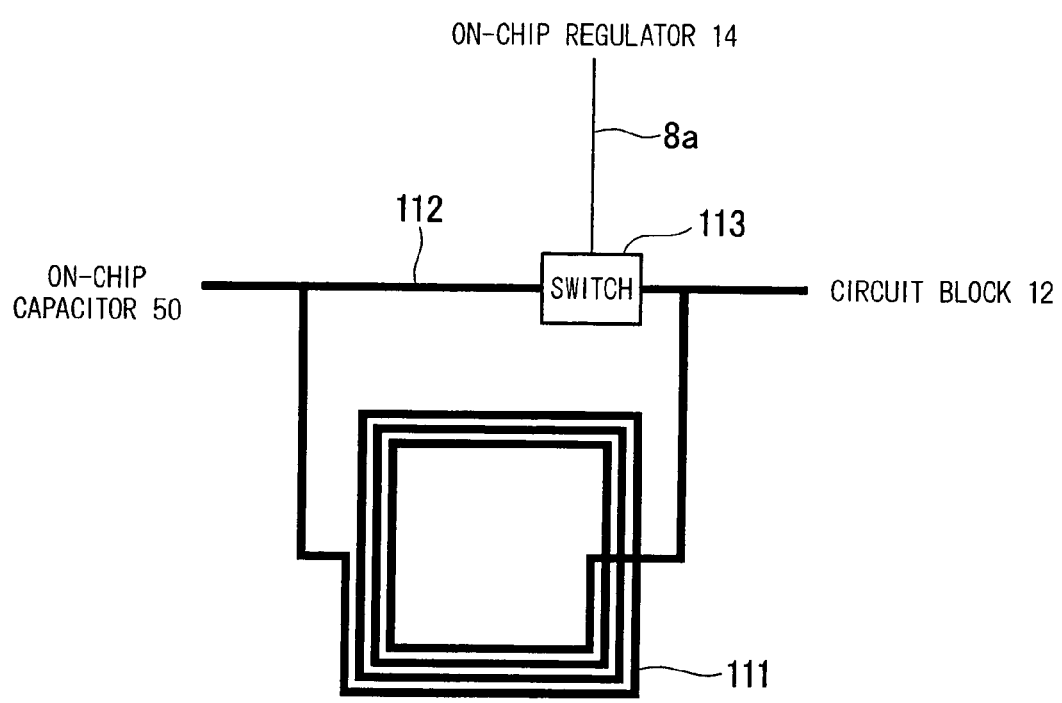
FIG. 13 is a diagram showing the structure of an example of a variable inductance component in the fourth embodiment of the present invention.

As shown in FIG. 11, on-chip capacitors 50 are arranged in the periphery of a circuit block 12 which is activated at a higher rate and for which noise is to be suppressed. Inductance-variable components 51 are inserted between the circuit block 12 and the on-chip capacitors 50. Each inductance-variable component 51 is provided with a power supply terminal, a ground terminal, and an inductance control terminal. Reference symbol 8a is an inductance control power supply line, which corresponds to the capacitance control power supply line 8. It should be noted that as shown in FIG. 13, each inductance-variable component 51 can be realized by a MEMS device using a switch 113 which is controlled by a signal supplied via the inductance control power supply line 8a and the inductance control terminal, and which is capable of switching between a large inductance path 111 (a first inductance path) and a small inductance path 112 (a second inductance path). The large inductance path 111 is realized by a spiral inductor, it has a larger inductance value than the inductance value of the small inductance path 112, and it is selected if the switch 113 is turned off. The small inductance path 112 is realized by a short circuit having a straight line shape, it is selected if the switch 113 is turned on, and it has a smaller inductance value than the inductance value of the large inductance path 111. Alternatively, as shown in FIG. 14A and FIG. 14B, each inductance-variable component 51 can be realized by a MEMS device which is capable of varying the distance (a relative position) between a spiral inductor 121 and a movable metal plate 122 arranged above the spiral inductor, which can be moved by an actuator 123 controlled by a signal supplied via the inductance control power supply line 8a and the inductance control terminal.

Noise suppression using such a structure can be realized by the impedance adjustment scheme shown in FIG. 12. For example, in a normal state (i.e., in the state in which the inductance value of the inductance-variable component 51 is minimized), the impedance profile thereof is an impedance profile 201. The impedance profile 201 includes anti-resonance impedance at a frequency f2 due to the on-chip capacitor 50 and the inductance value of the inductance-variable component 51, and hence noise is maximized when there is a current component at the frequency f2. Therefore, for example, in an operation in which current having the frequency f2 flows, the inductance value of the inductance-variable components 51 is intentionally increased (see an impedance profile 202 shown in FIG. 12) so as to shift the anti-resonance impedance, thereby making it possible to minimize the noise.

It should be noted that an example has been explained hereinabove in which a combination of an inductance-variable component and a capacitor is provided in a chip of the memory LSI 3. However, such a combination may be provided in a package or mounted on a printed circuit board.

Fifth Embodiment

Figure 15:
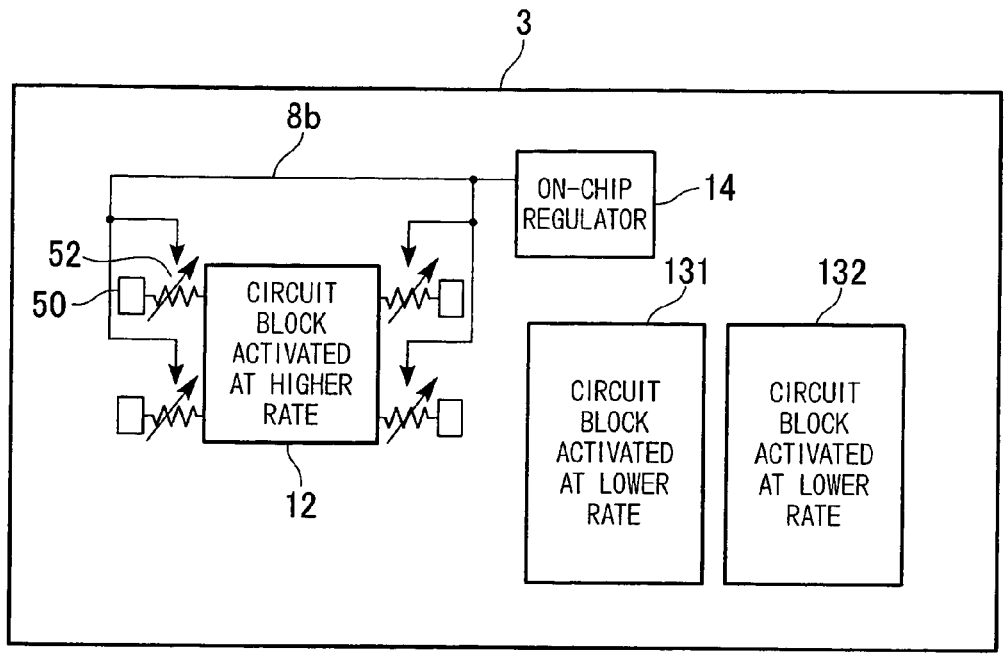
FIG. 15 is a diagram showing the structure of a semiconductor device in accordance with a fifth embodiment of the present invention, in which capacitors and resistance-variable resistors are provided in power supply lines.
Figure 16:
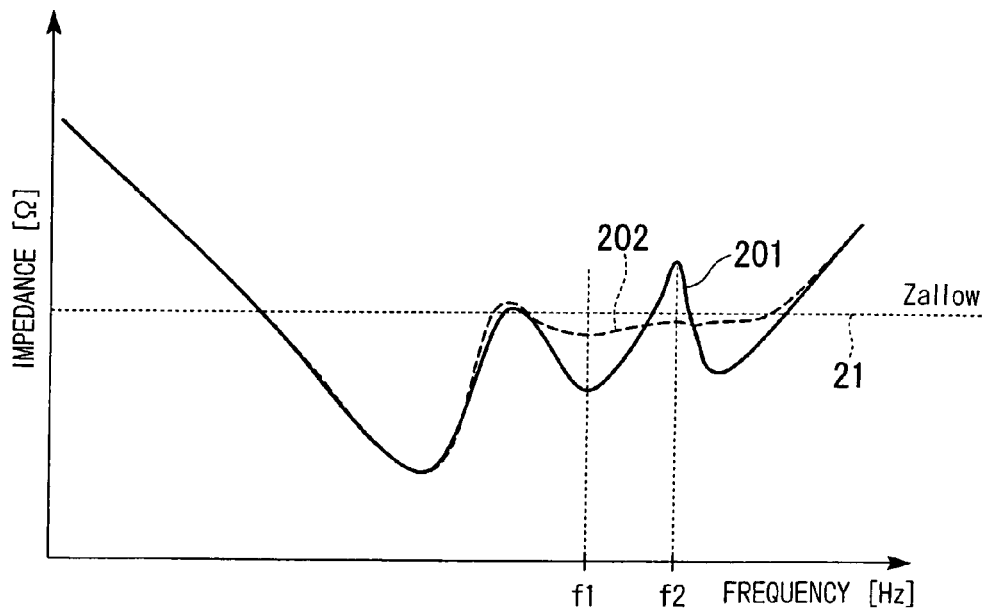
FIG. 16 is a diagram showing impedance profiles of a power supply system shown in FIG. 15, which is provided in the semiconductor device in accordance with the fifth embodiment of the present invention.

A fifth embodiment of the present invention realizes the impedance adjustment of a power supply system using resistance-variable components which are inserted in series relative to capacitors. The fifth embodiment of the present invention will be explained with reference to FIG. 15 and FIG. 16. FIG. 15 is a diagram showing the structure of a semiconductor device in accordance with the fifth embodiment of the present invention. FIG. 16 is a diagram showing impedance profiles of the power supply system in the semiconductor device in accordance with the fifth embodiment of the present invention.

Figure 17:
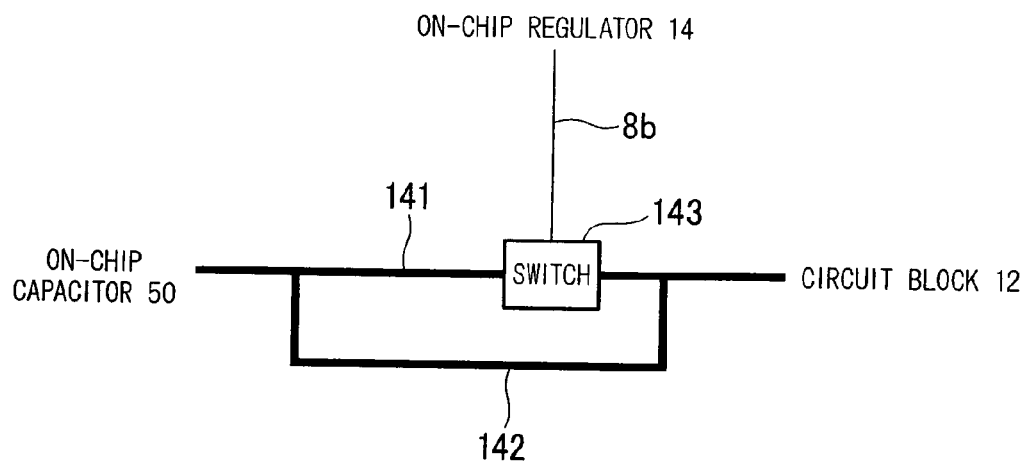
FIG. 17 is a diagram showing the structure of an example of a variable resistance component in the fifth embodiment of the present invention.

As shown in FIG. 15, on-chip capacitors 50 are arranged in the periphery of a circuit block 12 which is activated at a higher rate and for which noise is to be suppressed. Resistance-variable components 52 are inserted between the circuit block 12 and the on-chip capacitors 50. Each resistance-variable component 52 is provided with a power supply terminal, a ground terminal, and a resistance control terminal. Reference symbol 8b is a resistance control power supply line, which corresponds to the capacitance control power supply line 8. It should be noted that as shown in FIG. 17, each resistance-variable component 52 can be realized by a MEMS device using a switch 143 which is controlled by a signal supplied via the resistance control power supply line 8b and the resistance control terminal and which is capable of switching between a small resistance path 141 (a first resistance path; e.g., a short circuit) made of a metal material, which is selected if the switch 143 is turned on, and a large resistance path 142 (a second resistance path) made of a large resistivity material (i.e., a material having larger resistivity than that of the metal material), which is selected if the switch 143 is turned off.

Noise suppression using this structure can be realized by the impedance adjustment scheme shown in FIG. 16. For example, in a normal state (i.e., the state in which the resistance value of the resistance-variable component is minimized), the impedance profile thereof is an impedance profile 201. The impedance profile 201 includes anti-resonance impedance at a frequency f2 due to the capacitance of an on-chip capacitor and the inductance value of an inductance-variable component, and hence noise is maximized if there is a current component at the frequency f2. Therefore, for example, in an operation in which current having the frequency f2 flows, the resistance value of the resistance-variable components is intentionally increased (see an impedance profile 202 in FIG. 16) so as to reduce the anti-resonance impedance value, instead of increasing the resonance impedance value, thereby making it possible to minimize the noise.

It should be noted that an example has been explained hereinabove in which a combination of a resistance-variable component and a capacitor is provided in a chip of the memory LSI 3. However, such a combination may be provided in a package or mounted on a printed circuit board.

Moreover, various components including a variable capacitor, a variable inductor, and a variable resistor explained above may be combined with each other and used at the same time. A wider band can be covered by using a combination of a capacitance-controllable component and an inductance-controllable component as components for controlling the impedance value of the power supply system. Since a resonance frequency is defined by $(LC)^{-1/2}$, where L denotes inductance and C denotes capacitance, the structure in which both L and C are variable provides an advantage of increasing the degree of freedom in frequency selection.

Sixth Embodiment

Figure 18:
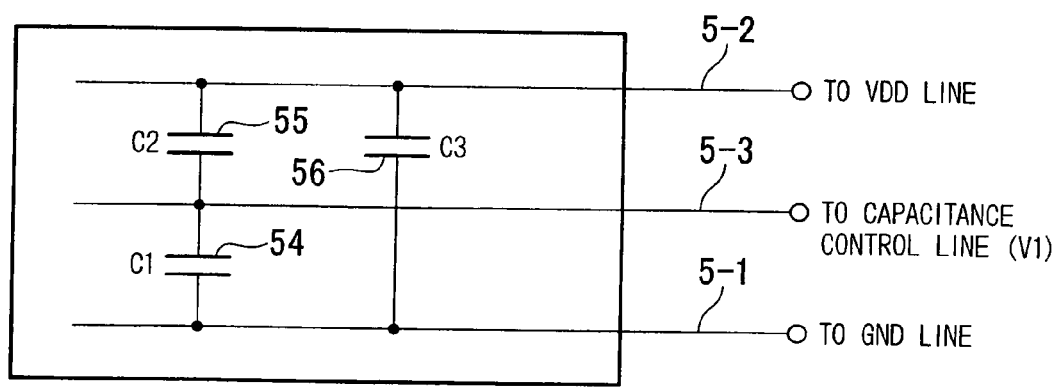
FIG. 18 is a diagram showing the structure of a decoupling capacitor, which is provided in a semiconductor device in accordance with a sixth embodiment of the present invention.

A sixth embodiment of the present invention is a specific example of a decoupling capacitor which can be used in a semiconductor device having the structure of the first embodiment (FIG. 1) or that of the second embodiment (FIG. 9). FIG. 18 shows the structure of this specific example. A terminal 5-1 is connected to a ground line (a GND line), which is connected to an integrated circuit which is the subject for which power supply noise thereof is to be reduced. A terminal 5-2 is connected to a power supply line (a VDD line) for supplying electric power to the integrated circuit. Reference symbol 5-3 is a capacitance control terminal connected to a capacitance control line.

A capacitor 54 (a first capacitor) having a capacitance value C1 is connected between the capacitance control terminal 5-3 and the terminal 5-1, a capacitor 55 (a second capacitor) having a capacitance value C2 is connected between the capacitance control terminal 5-3 and the terminal 5-2, and a capacitor 56 (a third capacitor) having a capacitance value C3 is connected between the terminal 5-2 and the terminal 5-1, thereby forming a capacitance-controllable decoupling capacitor. More specifically, the capacitance value between the terminal 5-1 and the terminal 5-2 can be set to one of three values shown in FIG. 19 by changing a voltage V1 applied to the capacitance control terminal 5-3 to a VDD level, a GND level, or high impedance Hi-Z (i.e., an open-circuit). Moreover, it is possible to continuously change the capacitance value in the range between a capacitance value (C1+C3) and a capacitance value (C2+C3) by setting the voltage V1 applied to the capacitance control terminal 5-3 to an intermediate level between the VDD level and the GND level.

It should be noted that as an example of the method for controlling the level of the voltage V1 applied to the capacitance control terminal 5-3, a switch element is inserted between the terminal 5-2 and the capacitance control terminal 5-3, and another switch element is inserted between the terminal 5-1 and the capacitance control terminal 5-3. This method allows control of the capacitance value so as to have one of the three capacitance values shown in FIG. 19. In this case, the operation of these two switch elements is controlled so that they are not simultaneously turned on.

As another example, a resistance-variable element is inserted between the capacitance control terminal 5-3 and the terminal 5-2, and another resistance-variable element is inserted between the capacitance control terminal 5-3 and the terminal 5-1, thereby making it possible to continuously change the voltage V1. In this case, the resistance values of the resistance-variable elements are set to sufficiently large values so as to prevent a large short-circuiting current from flowing between the VDD and the GND.

Figures 19, 20:
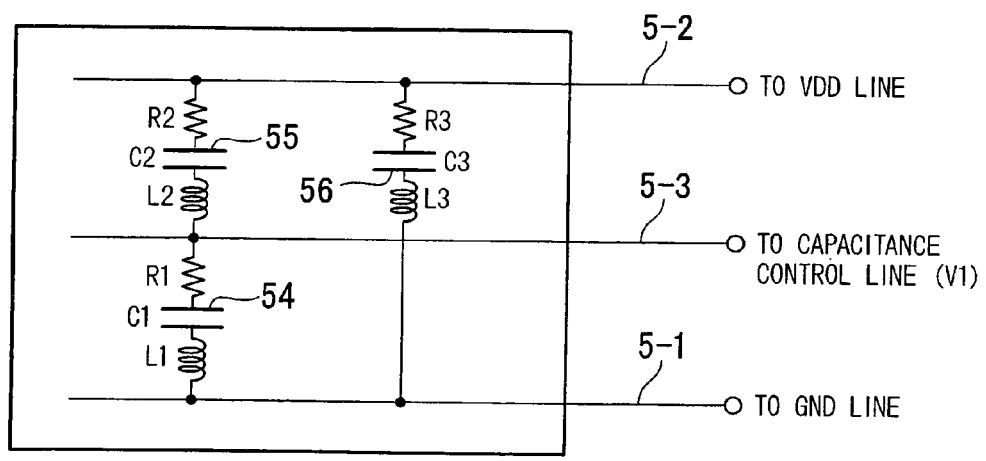
FIG. 19 is a diagram showing a method for controlling the capacitance value of the decoupling capacitor in the semiconductor device in accordance with the sixth embodiment of the present invention.
FIG. 20 is a diagram showing an equivalent circuit in which inductance components and resistance components which are parasitic on capacitors provided in the semiconductor device in accordance with the sixth embodiment of the present invention are also taken into consideration.

More exactly, in accordance with the above-described methods, capacitance is not the only component that is controlled by the level of the voltage V1 applied to the capacitance control terminal 5-3. As shown in FIG. 20, taking inductance components and resistance components which are parasitic to the capacitor 54, 55, and 56 into consideration, an inductance component (equivalent series inductance ESL) and a resistance component (equivalent series resistance ESR) between the VDD and the GND due to these inductance components and resistance components are controlled so as to have the values shown in FIG. 21. Therefore, with the decoupling capacitor in accordance with the sixth embodiment, the capacitance component, the inductance component, and the resistance component thereof can be controlled. As a result, it is possible to adjust the impedance profile of a power supply system for an integrated circuit which is the subject for which noise is to be reduced, and hence desired noise cut-off characteristics can be obtained.

Figures 21, 22:
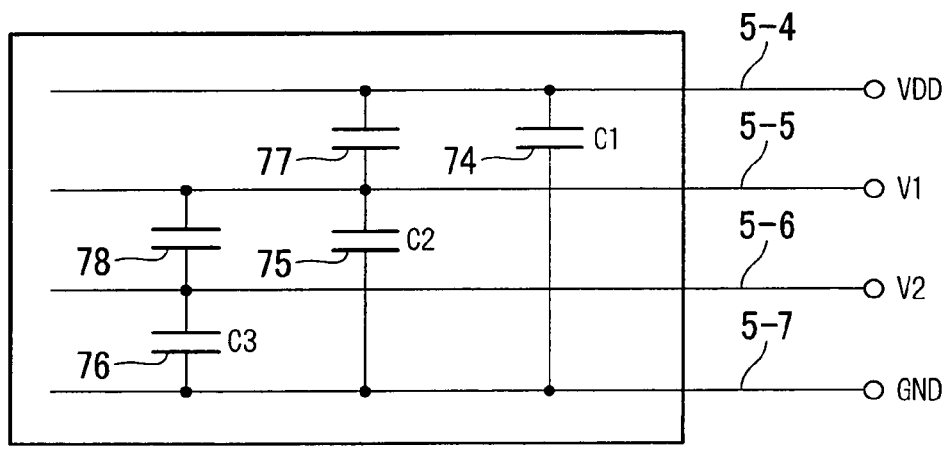
FIG. 21 diagram showing a method for controlling the capacitance value, the inductance value, and the resistance value of the decoupling capacitor in the semiconductor device in accordance with the sixth embodiment of the present invention.
FIG. 22 is a diagram showing a modified example of a decoupling capacitor, which is provided in the semiconductor device in accordance with the sixth embodiment of the present invention.

It should be noted that the aforementioned method is the simplest control method using a single control terminal. As shown in FIG. 22, two or more control terminals may be provided in order to more precisely control the impedance value. Specifically, a capacitor 74 having a capacitance value C1 is connected between a terminal 5-4 connected to a power supply line (a VDD line) and a terminal 5-7 connected to a ground line (a GND line), a capacitor 75 having a capacitance value C2 is connected between a capacitance control terminal 5-5 and the terminal 5-7, a capacitor 76 having a capacitance value C3 is connected between a capacitance control terminal 5-6 and the terminal 5-7, a capacitor 77 is connected between the terminal 5-4 and the capacitance control terminal 5-5, and a capacitor 78 is connected between the capacitance control terminal 5-5 and the capacitance control terminal 5-6. Assuming that the capacitance values of the capacitor 77 and the capacitor 78 are negligible for the sake of simplicity, the effective capacitance value between the VDD and the GND in the structure shown in FIG. 22 is represented by the capacitance values C1, C2, and C3 of the capacitors 74, 75, and 76. By changing the level of the voltage V1 applied to the capacitance control terminal 5-5 from the GND level to the VDD level, the effective capacitance value between the VDD and the GND changes from C to (C1+C2). Thereafter, by changing the level of a voltage V2 applied to the capacitance control terminal 5-6 from the GND level to the VDD level, the effective capacitance value between the VDD and the GND changes from (C1+C2) to (C1+C2+C3).

Seventh Embodiment

Figure 23:
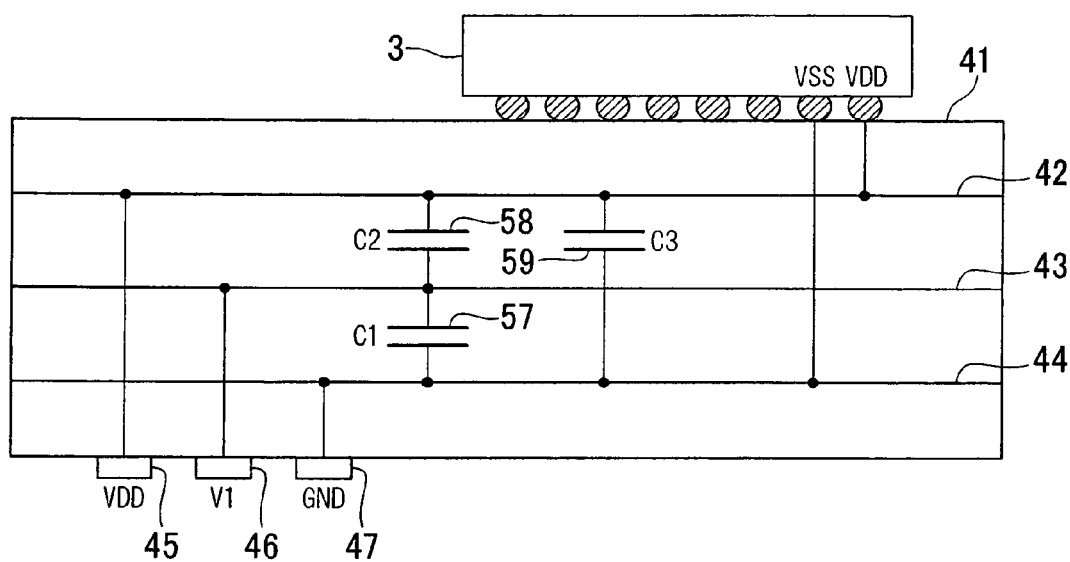
FIG. 23 is a diagram showing a memory module in accordance with a seventh embodiment of the present invention.

FIG. 23 shows a seventh embodiment of the present invention which arranges a circuit similar to that shown in FIG. 18 in a substrate on which an integrated circuit for which power supply noise is to be reduced is mounted, rather than in a decoupling capacitor. A memory LSI 3 is mounted on a memory module substrate 41 (a wire substrate), thereby forming a memory module. The memory module substrate 41 is provided with: a power supply plane 42 (a power supply line layer) for supplying electric power to the memory LSI 3; a ground plane 44 (a ground line layer); and a control plane 43 (a capacitance control line layer). Power supply potential VDD is applied to the power supply plane 42 via a pad 45. Ground potential GND is applied to the ground plane 44 via a pad 47. A capacitance control voltage V1 is supplied from a voltage regulator chip similar to that explained with reference FIG. 1 or FIG. 9 to the control plane 43 via a pad 46 (a capacitance control terminal). A capacitor 57 (a first capacitor) having a capacitance value C1 is connected between the control plane 43 and the ground plane 44. A capacitor 58 (a second capacitor) having a capacitance value C2 is connected between the power supply plane 42 and the control plane 43. A capacitor 59 (a third capacitor) having a capacitance value C3 is connected between the power supply plane 42 and the ground plane 44. In this way, the same circuit as the decoupling capacitor shown in FIG. 18 is formed. Therefore, similar to the sixth embodiment, the capacitance value between the VDD and the GND, which equivalently functions as a decoupling capacitor, can be controlled by controlling the level of the voltage V1 applied to the pad 46 so as to have a value in the range between (C1+C3) and (C2+C3) as shown in FIG. 19.

It should be noted that the capacitor 57, 58, and 59 are normally provided outside the memory module substrate 41. Alternatively, the capacitor 57, 58, and 59 may be formed in the memory module substrate 41. Since it is possible to control the effective capacitance value over a wide range by setting one of the capacitance value C1 and the capacitance value C2 to a small capacitance value, one of the capacitor 57 and the capacitor 58 may be realized by a parasitic capacitor formed between wire layers of the memory module substrate 41, instead of providing it outside the memory module substrate 41.

Instead of the memory module substrate 41, which mounts the memory LSI 3, a circuit board which mounts a memory control LSI for controlling the operation of a memory, a voltage regulator chip, and/or other LSIs may be configured to have the structure shown in FIG. 23.

As set forth above, the present invention made by the inventors of the present invention has been specifically explained based on the embodiments thereof. It is apparent that the present invention is not limited to the above embodiments, but may be modified and changed without departing from the scope and spirit of the invention. For example, the foregoing first to seventh embodiments may by suitably combined with each other.

What is claimed is:

1. A semiconductor device comprising:
   a first semiconductor integrated circuit;
   a ground line and a power supply line through which electric power is supplied to the first semiconductor integrated circuit;
   a variable impedance component which is connected between the ground line and the power supply line, and
   a second semiconductor integrated circuit which detects an operation of the first semiconductor integrated circuit and controls an impedance value of the variable impedance component based on the operation.

2. The semiconductor device according to claim 1, wherein the variable impedance component is provided in a package which seals the first semiconductor integrated circuit.

3. The semiconductor device according to claim 1, wherein the variable impedance component is provided in the first semiconductor integrated circuit.

4. The semiconductor device according to claim 1, wherein the variable impedance component is a decoupling capacitor which is provided with: a first terminal and a second terminal which are respectively connected to the ground line and the power supply line; and a capacitance control terminal, and the capacitance value of the decoupling capacitor varies in accordance with a voltage applied to the capacitance control terminal.

5. The semiconductor device according to claim 4, wherein the variable impedance component further comprises an inductance component which is connected in series relative to the decoupling capacitor and which is provided with an inductance control terminal, and the inductance value of the inductance component varies in accordance with a voltage applied to the inductance control terminal.

6. The semiconductor device according to claim 4, wherein electrodes which form the capacitance of the decoupling capacitor are made of a piezoelectric material.

7. The semiconductor device according to claim 4, wherein the decoupling capacitor is provided with: a first capacitor which is connected between the capacitance control terminal and the first terminal; a second capacitor which is connected between the second terminal and the capacitance control terminal; and a third capacitor which is connected between the first terminal and the second terminal.

8. The semiconductor device according to claim 4, further comprising a wire substrate on which the first semiconductor integrated circuit is mounted and which includes a power supply line layer in which the power supply line is provided, a ground line layer in which the ground line is provided, and a capacitance control line layer which is connected to the capacitance control terminal, wherein the decoupling capacitor is equivalently formed between the power supply line layer and the ground line layer by: a first capacitor which is connected between the capacitance control line layer and the ground line layer; a second capacitor which is connected between the power supply line layer and the capacitance control line layer; and a third capacitor which is connected to the power supply line layer and the ground line layer.

9. The semiconductor device according to claim 8, wherein one of the first capacitor and the second capacitor is a capacitor which is parasitically formed in the wire substrate.

10. The semiconductor device according to claim 1, wherein the variable impedance component is an inductance component which is provided with an inductance control terminal, and the inductance value of the inductance component varies in accordance with a voltage applied to the inductance control terminal.

11. The semiconductor device according to claim 10, wherein the inductance component is provided with:
- a first inductance path which is formed by a spiral inductor;
- a second inductance path which has an inductance value that is smaller than an inductance value of the first inductance path and which is formed by a short-circuit; and
- a switch which switches between the first inductance path and the second inductance path in accordance with the voltage applied to the inductance control terminal.

12. The semiconductor device according to claim 10, wherein the inductance component is provided with a spiral inductor and a metal plate, and the inductance value of the inductance component varies by changing the distance between the spiral inductor and the metal plate.

13. The semiconductor device according to claim 1, wherein the variable impedance component is a resistance component which is provided with a resistance control terminal, and the resistance value of the resistance component varies in accordance with a voltage applied to the resistance control terminal.

14. The semiconductor device according to claim 13, wherein the resistor component is provided with:
- a first resistance path which is made of a metal material;
- a second resistance path which is made of a material whose resistivity is larger than the resistivity of the metal material; and
- a switch which switches between the first resistance path and the second resistance path in accordance with the voltage applied to the resistance control terminal.

15. A semiconductor device comprising:
a first semiconductor integrated circuit;
a ground line and a power supply line through which electric power is supplied to the first semiconductor integrated circuit;
a variable impedance component which is connected between the ground line and the power supply line;
a second semiconductor integrated circuit which outputs a control signal to the first semiconductor integrated circuit to control the operation of the first semiconductor integrated circuit; and
a third semiconductor integrated circuit which controls the impedance value of the variable impedance component based on a control operation of the second semiconductor integrated circuit.

16. The semiconductor device according to claim 15, wherein the second semiconductor integrated circuit and the third semiconductor integrated circuit are integrated in a single semiconductor chip.

17. The semiconductor device according to claim 15, wherein the first semiconductor integrated circuit is a memory, the second semiconductor integrated circuit is a controller which controls the memory, and the control signal is a memory access command.

18. The semiconductor device according to claim 15, wherein the third semiconductor integrated circuit is a voltage regulator.

19. The semiconductor device according to claim 15, wherein the third semiconductor integrated circuit controls the impedance value of the variable impedance component such that a major frequency of a power supply current of the first semiconductor integrated circuit coincides with a resonance frequency of the variable impedance component.

20. A semiconductor device comprising:
a semiconductor integrated circuit;
a power supply system which supplies electric power to the semiconductor integrated circuit;
a variable impedance component whose impedance is varied to adjust the impedance of the power supply system; and
a second semiconductor integrated circuit which detects an operation of the first semiconductor integrated circuit and controls an impedance value of the variable impedance component based on the operation.

* * * * *